United States Patent [19]

Sanchez

[11] Patent Number: 5,102,815

[45] Date of Patent: Apr. 7, 1992

[54] METHOD OF FABRICATING A COMPOSITE INVERSE T-GATE METAL OXIDE SEMICONDUCTOR DEVICE

[75] Inventor: Julian J. B. Sanchez, Mesa, Ariz.

[73] Assignee: Intel Corporation, Santa Clara, Calif.

[21] Appl. No.: 784,577

[22] Filed: Oct. 29, 1991

Related U.S. Application Data

[62] Division of Ser. No. 630,155, Dec. 19, 1990.

[51] Int. Cl.$^5$ .................... H01L 21/336; H01L 21/28
[52] U.S. Cl. ...................................... 437/44; 437/189; 437/192
[58] Field of Search .................... 437/27, 40, 41, 44, 437/187, 186, 189, 192, 193, 228, 233; 357/23.3, 23.5; 156/643

[56] References Cited

U.S. PATENT DOCUMENTS

| | | | |
|---|---|---|---|
| 4,818,715 | 4/1989 | Chao | 437/186 |
| 4,837,180 | 6/1989 | Chao | 437/186 |
| 4,906,589 | 3/1990 | Chao | 437/186 |
| 4,951,100 | 8/1990 | Parrillo | 357/23.3 |
| 4,963,504 | 10/1990 | Huang | 437/44 |
| 4,978,626 | 12/1990 | Poon et al. | 437/233 |
| 4,988,632 | 1/1991 | Pfiester | 437/233 |
| 5,015,598 | 5/1991 | Verhaar | 437/44 |
| 5,015,599 | 5/1991 | Verhaar | 437/44 |
| 5,032,535 | 7/1991 | Kamijo et al. | 437/233 |
| 5,053,849 | 10/1991 | Izawa et al. | 357/23.5 |
| 5,061,647 | 10/1991 | Roth et al. | 437/44 |

FOREIGN PATENT DOCUMENTS

| | | | |
|---|---|---|---|
| 0390509 | 10/1990 | European Pat. Off. | 437/44 |
| 3935411 | 4/1990 | Fed. Rep. of Germany | 437/44 |
| 0125866 | 5/1989 | Japan | 437/44 |
| 0032539 | 2/1990 | Japan | 437/44 |
| 0035777 | 2/1990 | Japan | 437/44 |
| 0058236 | 2/1990 | Japan | 437/44 |
| 0078228 | 3/1990 | Japan | 437/44 |
| 0094634 | 4/1990 | Japan | 437/44 |
| 0106042 | 4/1990 | Japan | 437/44 |
| 0125433 | 5/1990 | Japan | 437/44 |
| 0138746 | 5/1990 | Japan | 437/44 |
| 0262340 | 10/1990 | Japan | 437/44 |
| 0009529 | 1/1991 | Japan | 437/44 |

OTHER PUBLICATIONS

Pfiester et al., "A Self-Aligned LDD/Channel Implanted ITLDD Process With Selectively-Deposited Poly gates for CMOS VLSI", IEDM 1989, pp. 769-772.

Primary Examiner—Mary Wilczewski
Attorney, Agent, or Firm—Blakey, Sokoloff, Taylor & Zafman

[57] ABSTRACT

A high speed submicron metal-oxide-semiconductor transistor which exhibits a high immunity to hot electron degradation. An inverse T-gate comprising a polysilicon upper member and a tungsten lower member is formed on a p type substrate. A gate insulating layer is formed between the composite gate and the p type substrate. A pair on n− source/drain regions are formed apart in the p type substrate in alignment with the sides of the polysilicon upper member for forming a lightly doped drain region. An oxide sidewall spacer is formed adjacent to each side of the polysilicon upper member on the tungsten lower gate member for forming a mask for a n+ source/drain implant. The n+ source/-drain implant is made in the n− source/drain regions in alignment with the oxide sidewall spacers for providing a source and a drain for the transistor. The tungsten lower gate member improves the transistors performance and makes the transistor viable for VLSI manufacturing techniques. The performance of the device can be further improved by placing silicide on the source gate and drain regions. The reliability of the device can be further improved by grading the doping of the drain an additional time.

5 Claims, 6 Drawing Sheets

METHOD OF FABRICATING A COMPOSITE INVERSE T-GATE METAL OXIDE SEMICONDUCTOR DEVICE

This is a divisional of application Ser. No. 07/630,155, filed Dec. 19, 1990.

BACKGROUUND OF THE INVENTION

1. Field of the Invention

The invention relates to the field of metal-oxide-semiconductor transistors. More particularly, it relates to the field of high speed submicron channel transistors. The invention realizes a transistor with a VLSI manufacturable porcess.

2. Description of Relevant Art

In submicron transistors hot electron injection into the gate is a serious reliability problem. Structures have been proposed in the attempt to design a high speed VLSI manufacturable submicron MOS transistor which exhibits resistance to hot electron degradation.

One such device is the lightly doped drain (LDD) transistor of FIG. 1. The LDD structure increases the transistor's resistance to hot electron degradation by decreasing the peak electric field of the device. The electric field is reduced by implanting lightly doped n— regions (between the gate edge and source/dranin regions), thereby spreading the drain voltage drop over a widen depletion region than with traditional devices. This technique, however, shows a significant increase in the source-drain series resistance of the device due to the n+ to gate offset caused by the n— implant. Since the n— region is not located under the gate, interface states generated during hot electron injection can reduce drive current significantly by reducing mobility. In addition, hot electron injection into the spacer region can result in trapped charge causing a local increase in the threshold voltage leading to an increase in series resistance. This in turn lowers drive current.

Another structure proposed to decrease hot electron degradation in submicron metal-oxide-semiconductor transistors is the gate to drain overlap LDD structrue (GOLD) of FIG. 2. With the GOLD structure a gate is formed above a lightly doped n— drain region creating a gate overlap of the drain. The GOLD structure, however, is not manufacturable in a production environment. The GOLD process depends on a natural oxide (5-10 Å) for an etch stop and requires a selective oxide to minimize the n+ to gate offset. Both these steps are difficult to control in a manufacturing environment. In addition the polysilicon is undercut underneath the CVD(1) oxide which is not controllable and difficult to measure. The GOLD device uses a polysilicon gate overlap over the n— region to significantly reduce the lateral electric field thereby minimizing hot electron generation. In addition, the polysilicon gate overlap minimizes series resistance due either to the lower doping or interface states. The gate to drain overlap structure, however, increases the gate/drain capacitance of the transistor. Though the increased gate/drain capacitance reduces the transistors speed and gain, the ability to fabricate shorter channel devices compensates in both higher transistor speeds and gain.

The final structure proposed for a reliable submicron transistor is the LDD transistor with an inverse T-gate shown in FIG. 3. The ITLDD also features a gate overlap (over the n— region) which produces that same benefits as observed in the GOLD device. The inverse TLDD or (ITLDD) transistor also features a self aligned n— gate to drain overlap and a self aligned n+ source/drain implant. The self alignment process minimizes the n+ to gate offset. Like the GOLD structure, however, the ITLDD transistor has a higher gate to drain capacitance due the the gate to drain overlap. The high capacitance reduces the device's performance, however, the ability to make shorter channels compensates for this limitation. The ITLLD structure is inappropriate for VLSI circuits because the inverse T-gate process requires a timed etch. When etching the polysilicon layer to form inverse T-gate there is no end point detection available to signal that the appropriate polysilicon overlap (shelf) thickness is present. Since the n— lightly doped drain region is implanted through the polysilicon shelf, any inconsistency in the shelf thickness would create an nonuniform doping structure.

Thus, what is desired is a high speed submicron transistor which is resistant to hot electron degradation and has a VLSI manufacturable process.

SUMMARY OF THE INVENTION

A high speed submicron metal-oxide-semiconductor transistor fabricated on a p type substrate is described. The transistor inlcudes a composite inverse T-gate comprised of a shorter n+ polysilicon upper gate member formed on a longer tungsten lower gate member. The composite inverse T-gate is formed over a gate dielectric grown on a p type substrate. N— source/drain regions are disposed apart in the p type substrate and formed in alignment with each edge of the n+ polysilicon upper gate member for forming a lightly doped drain region. N+ source-drain regions are disposed within the n— lightly doped drain regions and are self-aligned with each edge of the tungsten lower gate member. An oxide sidewall spacer is formed adjacent to each side of the n+ polysilicon upper gate member and used to form a mask for the n+ source/drain implants and for the tungsten lower gate member. The tungsten lower gate member significantly increases the transistor's conductance, and thereby offsets the added capacitance created by the gate overlap of the lightly doped drain. The tungsten lower gate member also acts as an an etch stop for the polysilicon etch. The resultant transistor has high immunity to hot electron degradation and is viable for VLSI manufacturing techniques.

The performance of the device can be further improved by reducing the contact resistance of the device. The contact resistance can be reduced by placing silicide on the n+ source/drain regions and on the n+ polysilicon upper gate member. A second pair of oxide sidewall spacer are utilized to prevent the n+ source/drain regions from becoming shorted to the composite gate by the silicide process. The reliability of the device can also be improved by grading the doping of the drain an additional time.

BRIEF DESCRIPTION OF THE DRAWINGS

FIG. 7b illustrates the formation of a polysilicon upper gate member on the substrate of FIG. 7a.

FIG. 8b illustrates the removal of the gate oxide layer over the n+ source/drain regions of FIG. 8a.

FIG. 9b illustrates the removal of tungsten over the n+ source-drain regions of FIG. 9a.

DETAILED DESCRIPTION OF THE PRESENT INVENTION

The present invention discloses a novel high speed submicron metal-oxide-semiconductor transistor which exhibits resistance to hot electron degradation while not decreasing device performance. In the following description, numerous specific details are set forth in order to provide a thorough understanding of the present invention. However, it will be obvious to one skilled in the art that the present invention may be practiced without these specific details. In other instances, well known metal-oxide-semiconductor (MOS) transistor concepts and fabrication techniques have not been set forth in detail in order to not unnecessarily obscure the present invention.

The currently preferred embodiment of the present invention is a high speed submicron metal-oxide-semiconductor (MOS) transistor which exhibits resistance to hot electron degradation without device performance. The structure of the transistor is ideal for VLSI manufacturing techniques.

The present invention realizes a transistor which can be used in the latest high density VLSI circuits. The latest VLSI circuits attempt to pack transistors in higher and higher densities. It is, thererfore, extremely advantageous to decrease the dimensions of the metal-oxide-semiconductor field-effect transistor in order to increase the transistor density of VLSI circuits. Present MOS transistors have channel lengths on the order of one micron (1 $\mu$m). The present invention is a MOS transistor which shows good reliability and performance while having a channel length of only 0.3-0.5 $\mu$m and operating at 5 v. The difficulty with producing such small channel transistors is that the electric field, for a given voltage, increases as the channel length decreases. It is well known that high electric fields near the drain induce hot electrons into the gate. In order to reduce the hot electron injection, the peak electric field of the device must be decreased. The peak electric field, however, must be decreased without significantly reducing device performance.

It is to be noted that "n++", "n+" and "n−" are used throughout the present disclosure. The short hand notation specifies the electron concentration of various regions of a metal-oxide-semiconductor device. For instance, "n−" specifies a region of light electron concentration (around $1 \times 10^{18}$/cm$^3$) while "n++" specifies a region of high electron concentration (around $1 \times 10^{20}$/cm$^3$). It is also to be noted that "gate length" is used in the normal convention and is used to refer to the size of the lower gate member.

Figure 1:
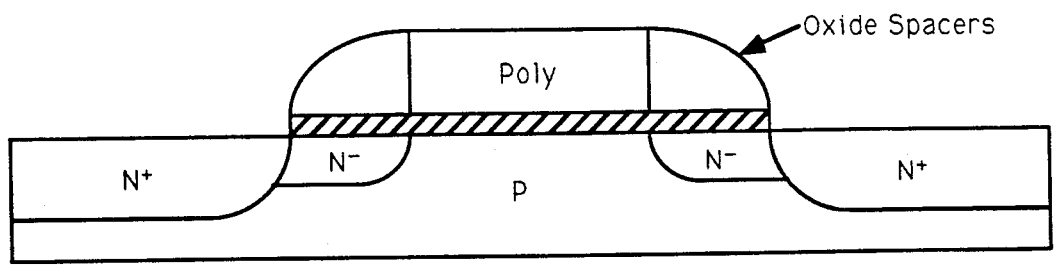
FIG. 1 is a cross sectional elevation view of a prior art lightly doped drain (LDD) transistor.
Figure 2:
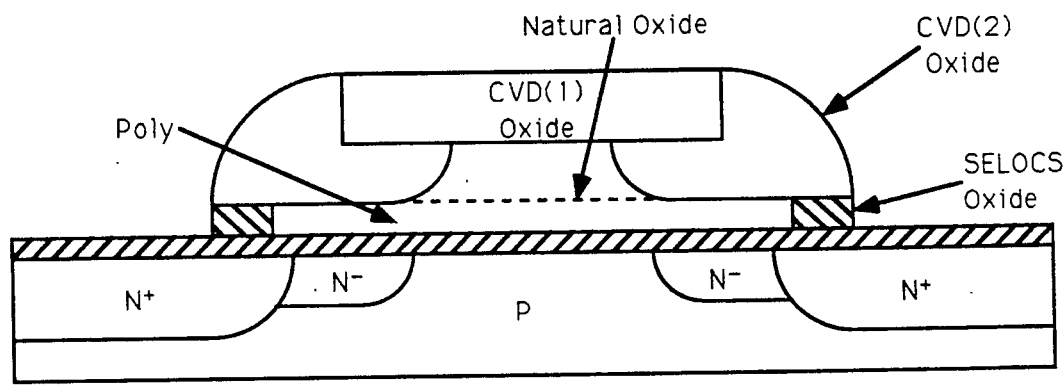
FIG. 2 is a cross sectional elevation view of a prior art gate-drain overlap (GOLD) transistor.
Figure 3:
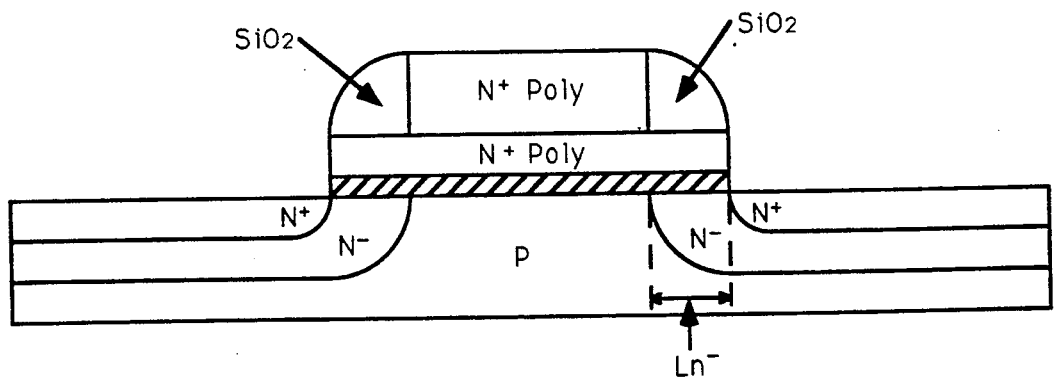
FIG. 3 is a cross sectional elevation view of a prior art LDD transistor with an inverse T-gate.
Figure 4:
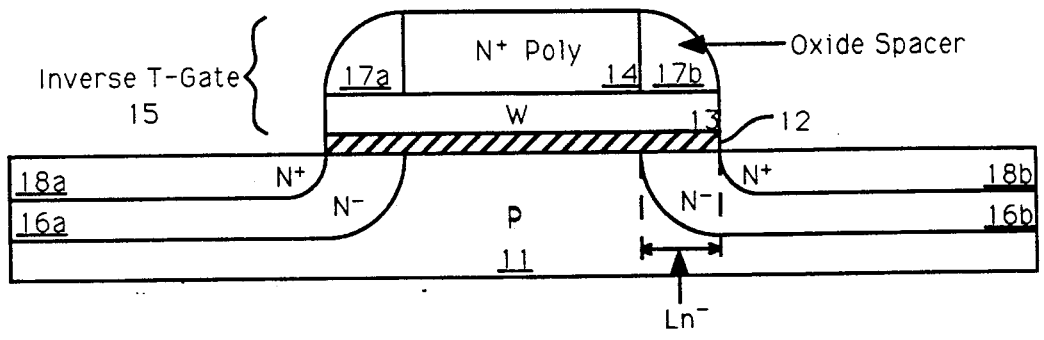
FIG. 4 is cross sectional elevation view of a composite inverse T-gate device of the present invention.

The present preferred embodiment of the present invention is shown in FIG. 4. The device is formed in a p type substrate 11 which provides the channel region for the n-channel MOSFET; a gate oxide region 12 is formed on the p type substrate. A tungsten lower gate member 13 is formed on the gate oxide layer 12. An n+ polysilicon upper gate member 14 is formed on the tungsten lower gate member 13. The polysilicon upper gate member 14 has a length less than the tungsten lower gate member 13 thereby giving the whole gate or composite gate an "inverse T" configuration 15. First source/drain regions of an n− polarity 16a and 16b are disposed in the p type substrate 11 in alignment with the edges of the n+ polysilicon upper gate member 14. Oxide sidewall spacers 17a and 17b are formed adjacent to each side of the n+ polysilicon upper gate member 14 on the tungsten lower gate member 13. Second source/drain regions 18a and 18b of an n+ polarity are formed in the n− source-drain regions 16a and 16b, respectively, in alignment with the sides of the tungsten lower gate member 13.

The present invention, by utilizing two source/drain regions, creates a lightly doped drain structure which increases the device's reliability by decreasing the peak electric field. The LDD structure uses both a lower doping and grading for the drain. The n− lightly doped source/drain regions 16a and 16b provide a lightly doped drain region for the transistor. The n+ source/drain regions 18a and 18b provide ohmic contacts for the transistor. The double source/drain structure reduces the peak electric field for a given voltage by spreading the drain voltage drop over a wider depletion area. The drive capability of the device, however, is significantly reduced due to the increase in drain resistance caused by the n− lightly doped drain regions 16a and 16b.

It should be noted that the n− regions 16a and 16b are formed deeper into the p type substrate than the n+ regions 18a and 18b thereby giving the transistor a sloped junction. A sloped junction helps to reduce the hot electron injection into the gate by drawing the current away from the surface and separating the maximum current density from the maximum field.

The present invention, by placing the tuntgsten lower gate member 13 over the n-lightly doped drain regions utilizes a gate to drain overlap structure. The overlap is shown as Ln− 19 in FIG. 4. The overlap structure increases the reliability and the performance of the transistor by positioning the peak electric field underneath the gate. Locating the peak electric field underneath the gate increases the lifetime of the device by minimizing the voltage drop between the drain and the channel when the gate voltage is high thereby reducing the lateral field. Also, locating the peak electric field underneath the gate minimizes the ability of localized charges to raise the drain resistance and thereby decrease the transistors performance. With the gate overlap of the drain a lower n− doping can be used than in the traditional LDD structures thereby allowing further reductions in the lateral field. In other words, reductions in drive capability caused by the lower doped drain can be minimized by locating the peak electric field underneath the gate. The drain-to-gate overlap region Ln−, however, increases the drain/gate capacitance of the device by about 20%, however, this is offset by the shorter channel lengths made possible.

An inverse T-gate 15 is used in the present invention. The inverse T-gate provides a manufacturable process for forming the gate overlap of the drain and placing the electric field beneath the gate. The inverse-TLDD structure allows for the n− LDD regions 16a and 16b and the n+ source/drain regions 18a and 18b to be self aligned to the inside and outside edge, respectively, of the inverse T-gate structrue 15. The self alignment process removes the possibility of operator misalignment which can result in an undesired n+ to gate offset. The self alignment process helps to guarantee uniformity of device structure across a wafer.

The present invention utilizes a composite inverse T-gate. The gate is similar to that of a traditional inverse T-gate structure of the prior art except that the lower gate member is tungsten instead of polysilicon. The composite gate provides both process and performance improvements over traditional ITLDD devices. The process is improved because the tungsten lower gate provides an etch stop relieving the (ITLDD) process of a timed etched step. The performance is improved because the composite gate provides the benefits of both polysilicon gates and tungsten gates. The polysilicon upper gate member getters moisture and hydrogen, retaining the hot electron resistant properties of traditional polysilicon gates.

The tungsten lower gate member 13 of the present invention improves the device's performance in a number of ways. Tungsten's low gate resistance (10 $\mu\Omega$-cm) helps to offset the negative effects caused by the increased gate/drain capacitance from the gate overlap of the drain. Tungsten is also better than n+ doped polysilicon for submicron gates because of its near-mid gap work function approximately equal to 4.8 electron volts. The higher work function leads to threshold values of approximate 0.7 v without the need for a gate implant. This leads to a 20% higher saturation transconductance (Gm) and a 35% increase in mobility than polysilicon gate devices. The higher work function also increases the punch through voltage. These factors increase both the speed and performance of the device. The composite gate both improves the device's performance and the manufacturability of the process.

Figure 5:
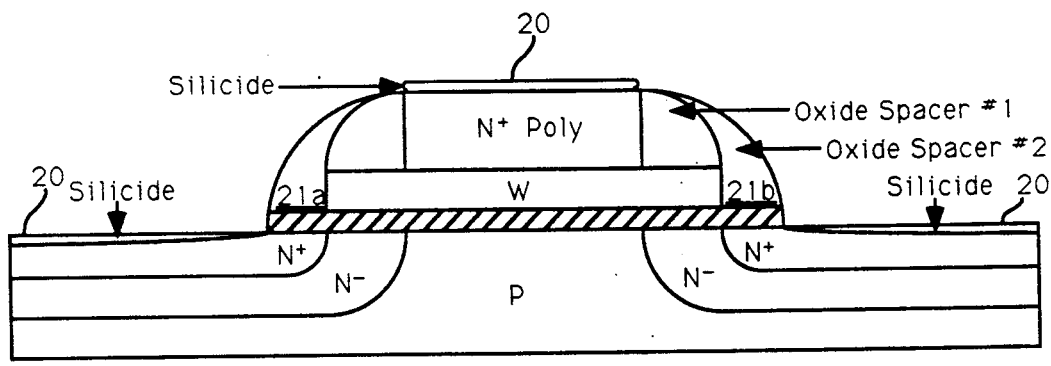
FIG. 5 is a cross sectional elevation view of a silicide composite inverse T-gate device of the present invention using oxide spacers.

Referring to FIG. 5, the performance of the composite inverse T-gate device can be further improved by forming silicide 20 on the gate, source and drain regions. The structure of the silicide composite inverse T-gate is the same as the composite inverse T-gate except that second oxide spacers 21a and 21b are utilized to mask the edges of the tungsten lower gate member from the silicide process. The second oxide spacers 21a and 21b prevent the silicide from shorting the gate to the source or from shorting the gate to the drain. The silicide process reduces the contact resistance of the device, and thereby improves the device's performance.

Figure 6:
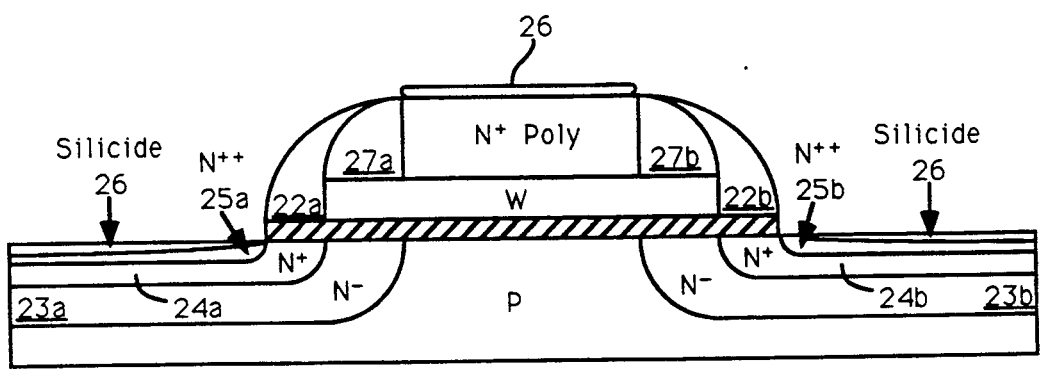
FIG. 6 is a cross sectional elevation view of a tri-silicide composite inverse T-gate device of the present invention.

The silicide composite inverse T-gate device can be made even more resistance to hot electron degradation by further grading the doping of the drain. The tri-silicide composite inverse T-gate is shown in FIG. 6. After forming the n− source/drain regions 23a and 23b and the first oxide spacers 27a and 27b, n+ source/drain regions 24a and 24b are implanted in alignment with the first oxide spacers 27a and 27b and the tungsten lower gate member 13. The second oxide spacers 22a and 22b are then formed. The n++ implant for the n++ source/drain regions 25a and 25b are aligned to the second oxide spacers 22a and 22b. Silicide 26 is formed on the gate, drain, and source regions of the device to reduce its contact resistance. The additional source/drain regions 24a and 24b provide for greater tailoring of the drain region thereby further improving the device's resistance to hot electron injections.

Figure 7A:
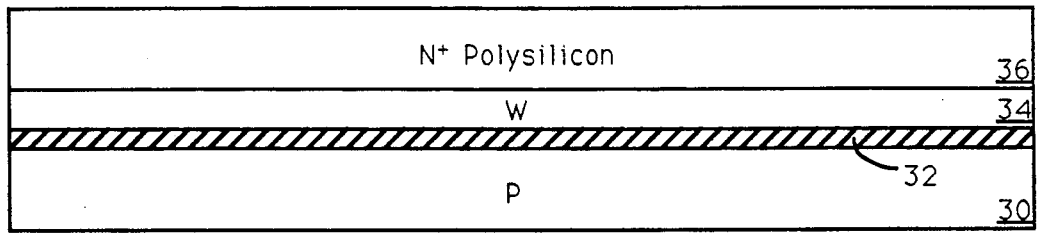
FIG. 7a is a cross sectional elevation view of a substrate which includes a gate oxide layer, a tungsten layer and a polysilicon layer.

In fabrication of the invented submicron metal-oxide-semiconductor transistor with the presently preferred process, a p type silicon substrate 30 shown in FIG. 7a is used. The resistivity of the p type substrate 30 is doped in a range of 1 to 50 ohms-cm. A 100 Å thick gate oxide layer 32 is grown over the p type substrate. The gate oxide layer 32 is grown in a diffusion furnace at 920° C. at atmosphere for 40 minutes in 97% $O_2$ and 3% TCA. A 1000 Å thick tungsten layer 34 is sputtered on the gate oxide layer 32. The tungsten layer 34 is sputtered from a tungsten target at a pressure of 55 mtorr and a power of 6 kw in Argon. A 2,500 Å thick polysilicon layer 36 is then deposited on the tungsten layer. The polysilicon layer 36 is formed by LPCVD in $SiH_4$ at a pressure of 130–190 mtorr and a temperature of 615° C. The polysilicon layer is then doped to an n+ conductivity with $POCl_3$ in a diffusion furnace at 920° C. at atmosphere.

Figure 7B:
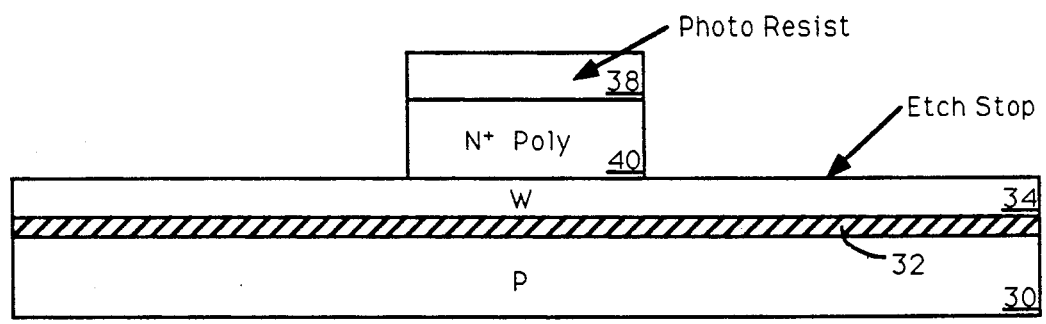

Referring to FIG. 7b, a photoresist layer 38 is deposited, masked, exposed, and developed defining the length and location where the polysilicon upper gate member 40 will be formed. The entire polysilicon layer 36 is etched away except for the area masked by the photoresist. An etchant is chosen which is highly selective to polysilicon than to tungsten, so that when an area of the device reaches the tungsten layer 34 it will basically stop etching while another area of the device not yet through the polysilicon layer will continue to etch the polysilicon until the tungsten layer 34 is reached. A reactive ion etch with $CF_4/O_2$ at a power of 250 watts and a pressure of 2.00 T may be used. The completion of the polysilicon etch is end point detected by analyzing the residual gas exhausted during the etch. Each device on a wafer, therefore, will have substantially the same uniform lower tungsten layer 34 after etching the polysilicon layer 36.

When manufacturing a prior art inverse T-gate devices, a thin polysilicon shelf is left behind to form the lower gate member. The thickness of the polysilicon shelf is determined by a timed etch. A timed etch is unsatisfactory because the thickness of the polysilicon layer can vary from wafer to wafer which will result in an nonuniform polysilicon shelf. Because an n− implant is performed later through the thin polysilicon shelf any nonuniformity in the shelf thickness results in changes to the LDD profile. The LDD profile strongly influences the degree of hot electron activity. In the present invention the tungsten layer guarantees an uniform n− implant by allowing end point detection of the tungsten layer signalling completion of the polysilicon etch. Because of the large number of transistors being fabricated, uniformity in device structure is extremely important for the reliability of VLSI circuits.

Figure 7C:
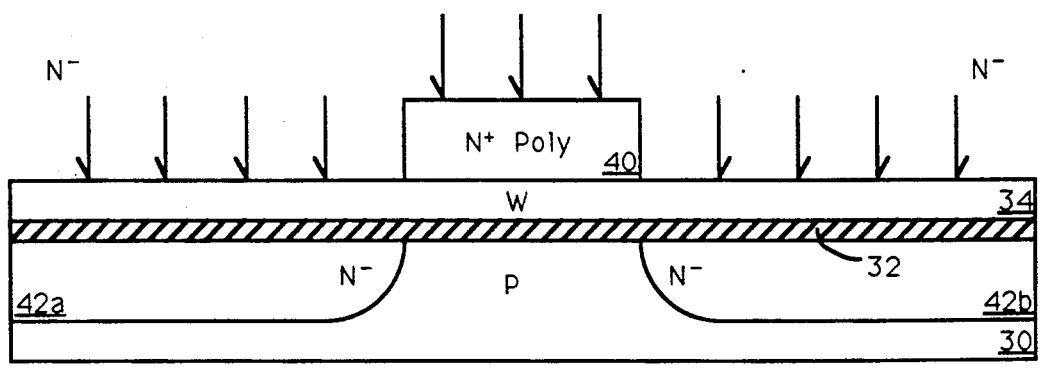
FIG. 7c illustrates the formation of n− lightly doped source/drain regions in the p type substrate of FIG. 7b.

In FIG. 7c the n− source/drain regions 42a and 42b are formed. The photoresist layer 38 which was used to define the upper polysilicon gate member is removed with typical process techniques. An n− dopant implant of phosphorous atoms with a doping density on the order of $5 \times 10^{12}$ atoms/cm$^2$ and an energy of approximately 50 kev is made through the gate oxide and tungsten layers to form the lightly doped drain region 42a and 42b. It is to be noted that the source at this time also becomes lightly doped since a symmetrical MOS device is being manufactured.

The entire device structure is subjected to the n− dopant. The polysilicon upper gate member 40 acts as a mask to prevent the p type substrate from becoming doped to an n− polarity. Although the n− lightly doped source/drain regions are formed in alignment with the polysilicon upper gate member, some of the phosphorous atoms during later process steps may laterally diffuse into the channel region of the device. This is minimized by use of lower temperatures and short process times in the remainder of the process.

Figure 7D:
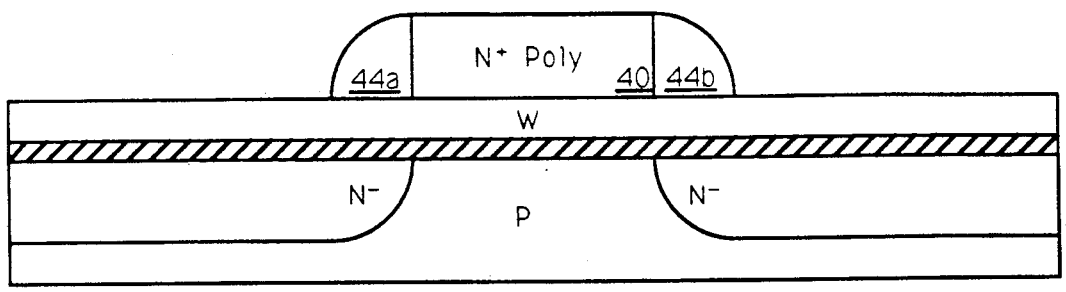
FIG. 7d illustrates the formation of oxide sidewall spacers on the substrate of FIG. 7c.

In reference to FIG. 7d the oxide sidewall spacers 44a and 44b are formed next. A 2000 Å thick low temperature oxide w/8% phosphorus is deposited over the entire device. The oxide layer is formed in 60% $O_2$, 11% $SiH_4$ and 29% DPI (which is 15% phosphine and 85% silane) at a temperature of 400° C. and a pressure of 115 mtorr. The oxide layer is anisotropically etched to form an oxide sidewall spacer on each side of the polysilicon upper gate member 40. The oxide sidewall spacers 44a and 44b serve as a mask to offset the n+ source/drain implant.

Figure 7E:
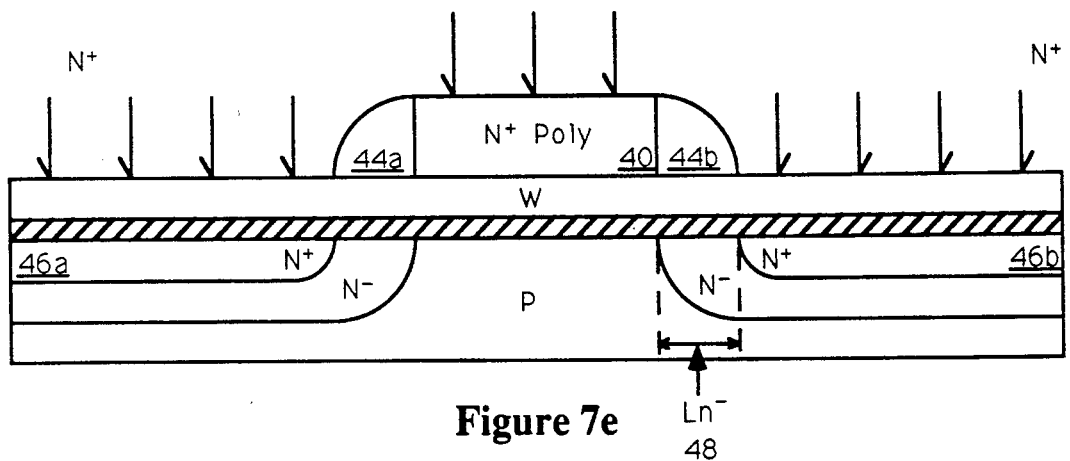
FIG. 7e illustrates the formation of n+ source/drain regions in the substrate of FIG. 7d.

Referring to FIG. 7e, the n+ source/drain regions 46a and 46b are formed by implanting arsenic atoms at a density of $1 \times 10^{15}$ atoms/cm$^2$ at an energy of 80 kev through the gate oxide and tungsten layers. The upper polysilicon gate member 40 serves as a mask to shield the channel region from the n+ implant. It is to be appreciated that the n+ source/drain implant is formed in alignment with the outer edges of the oxide sidewall spacers. However, later process steps may cause the n+ source and drain regions to laterally diffuse slightly into the lightly doped drain region. This is minimized by using low temperature processing on the backend of the process.

The amount of offset (Ln−) 48 of the n+ source/drain regions 46a and 46b from the channel region may easily be adjusted by changing the length of the oxide sidewall spacers. The amount of offset is dependent upon the specific application of the VLSI circuit. An application which requires greater reliability would have a larger Ln− region while an application which requires higher performance would have a smaller Ln−. The oxide sidewall spacers allow for freedom to optimize the reliability and performance of a circuit to a particular application.

Figure 7F:
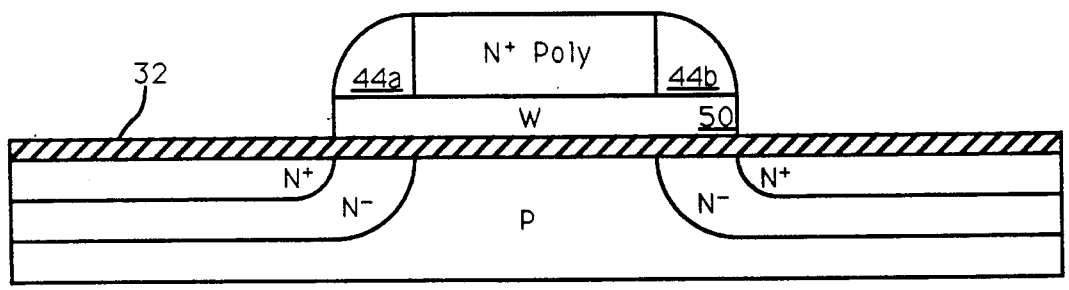
FIG. 7f illustrates the removal of tungsten over the n+ source/drain regions on the substrate of FIG. 7e.

Referring to FIG. 7f the tungsten is removed over the n+ source/drain regions 46a and 46b. The oxide sidewall spacers 44a and 44b serve as a mask for removing the tungsten over the n+ source/drain regions 46a and 46b and completing the inverse T-gate structure. The tungsten layer over the n+ source/drain regions 46a and 46b is etched away with a reactive ion etch (RIE) of $CF_4/O_2$ at a power of 250 watts and a pressure of 2.00 T. The RIE leaves the gate oxide layer 32 over the n+ source and drain regions. Since the oxide spacers 44a and 44b serve as a mask in the formation of both the n+ source/drain regions and the tungsten lower gate member 50, the n+ source/drain regions 46a and 46b are self-aligned to the tungsten lower gate member 50. The tungsten lower gate member 50 with a 100 Å gate oxide layer has a threshold voltage of between 0.6–0.7 v without the need for a threshold adjusting implant.

Figure 7G:
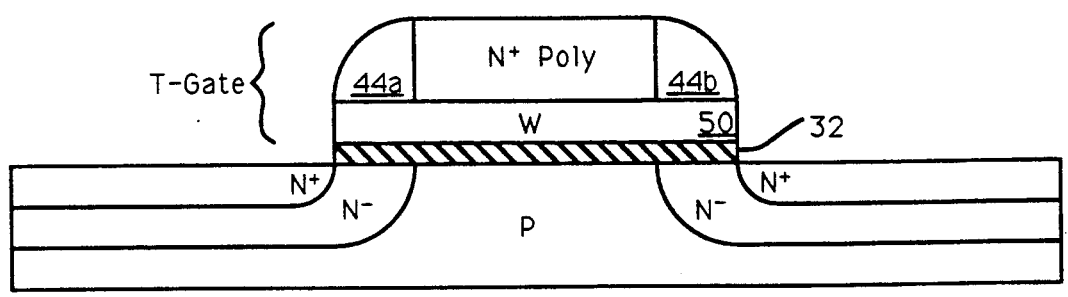
FIG. 7g illustrates the completed composite inverse T-gate of the present invention.

In reference to FIG. 7g, the gate oxide layer 32 over the n+ source/drain regions is removed to reveal the n+ source and drain regions. It is to be appreciated that if desired the tungsten lower gate member 50 and the oxide gate layer 32 may be etched simultaneously to reveal the composite inverse T-gate MOS device of FIG. 7g.

FIG. 7g depicts the high speed, submicron, metal-oxide-semiconductor transistor of the present invention. The transistor has a composite inverse T-gate structure which increases the device's reliability and performance. The device is also well suited for VLSI manufacturing techniques because of the end point detection available from the tungsten lower gate member 32 and the utilization of oxide spacers 44a and 44b to self-align the n+ source/drain regions.

Figure 8A:
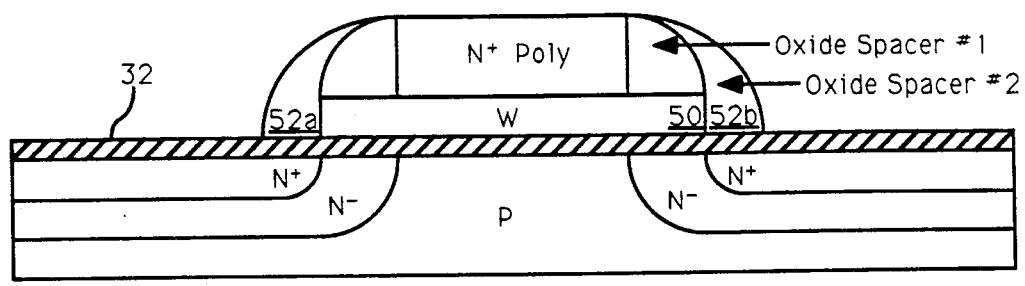
FIG. 8a illustrates the formation of a second oxide spacer on the substrate of FIG. 7f used in the formation of the silcide composite inverse T-gate device of the present invention.
Figure 8B:
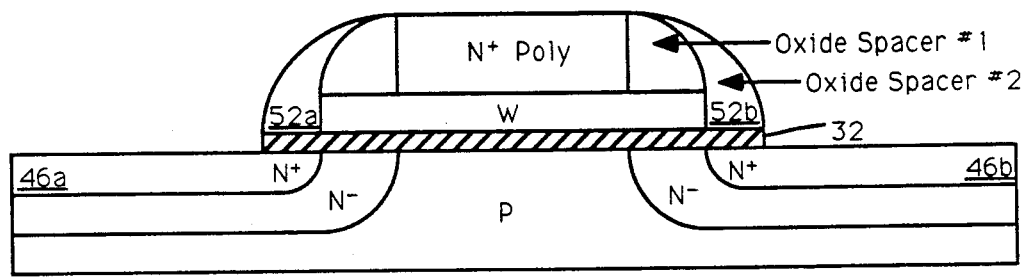

In FIG. 8a the process is continued from FIG. 7f in order to fabricate the silicide composite inverse T-gate. A second pair of oxide spacers 52a and 52b are utilized to mask the tungsten lower gate member from a silicide layer. The second oxide spacers prevent the source and drain regions from being shorted to the gate by the silicide. The second oxide spacers are formed by depositing a 4000 Å low temperature oxide (LTO) over the device. The LTO layer is etched anisotropically in $CF_4/CHF_3$ at a pressure of 3.2 T and a power of 1000 watts. Normally the second oxide spacers 52a and 52b are formed over the gate oxide layer 32 after the tungsten lower gate member 50 is formed in FIG. 7f. The remaining gate oxide layer 32 over the n+ source/drain regions is etched away to reveal the n+ source/drain regions 46a and 46b as shown in FIG. 8b. If desired however, the second oxide spacers 52a and 52b may be formed on the n+ source/drain regions 46a and 46b after the gate oxide layer 32 has been removed as shown in FIG. 7g.

Figure 8C:
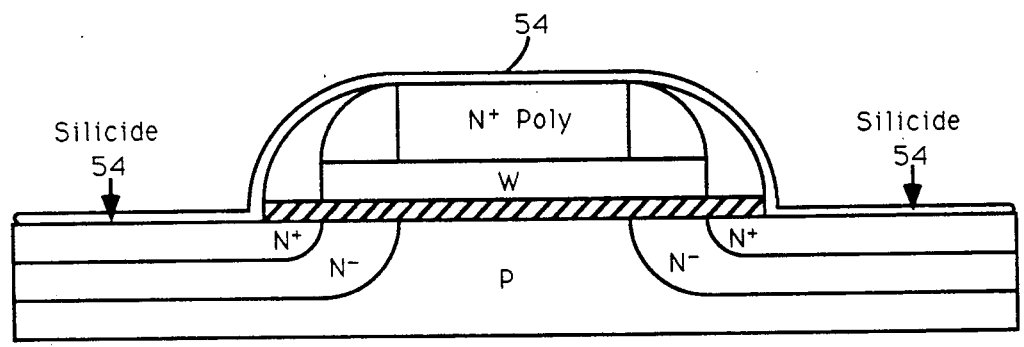
FIG. 8c illustrates the formation of a silicide layer on the substrate of FIG. 8b.
Figure 8D:
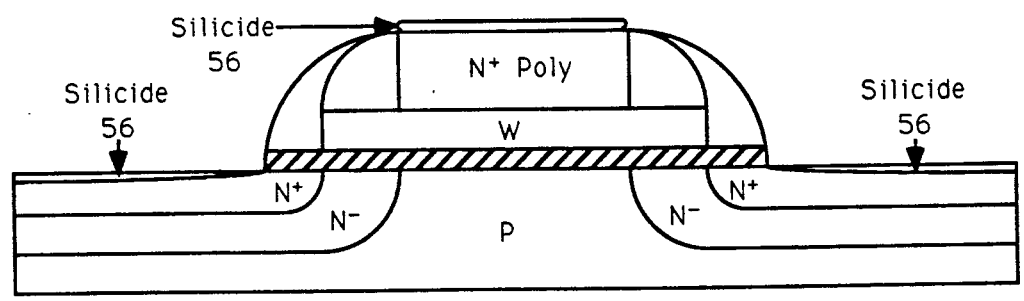
FIG. 8d illustrates the substrate of FIG. 8c after the silicide layer is selectively wet etched to form the silicide composite inverse T-gate device of the present invention.

Now, as shown in FIG. 8c, titanium silicide at a thickness of 600 Å is sputtered in argon at a pressure of 2 mtorr and a power of 6 kw over the entire structure and annealed in $N_2$ at a temperature of 625° C. Then, as shown in FIG. 8d, the device is wet etched thereby selectively removing the titanium silicide deposited over the second oxide spacers and leaving silicide 56 on the gate, source and drain of the device. The silicide process decreases the resistivity of the n+ source/drain regions from 20 ohms/square to 4 ohms/square. The silicide process also reduces the contact resistance of the device. If desired, the oxide sidewall spacers 44a, 44b, 52a and 52b may now be removed with a hydrofluoric wet etch.

Figure 9A:
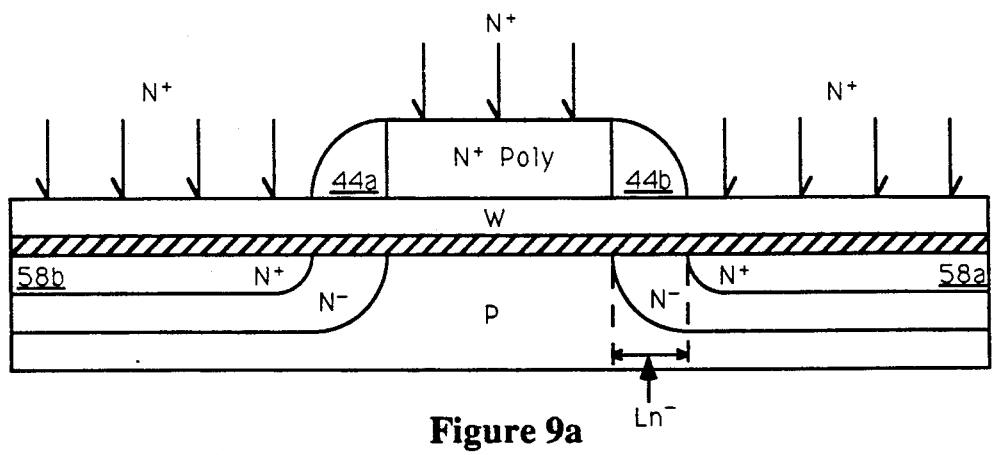
FIG. 9a illustrates the formation of n+ source-drain regions in the substrates of FIG. 7d.
Figure 9B:
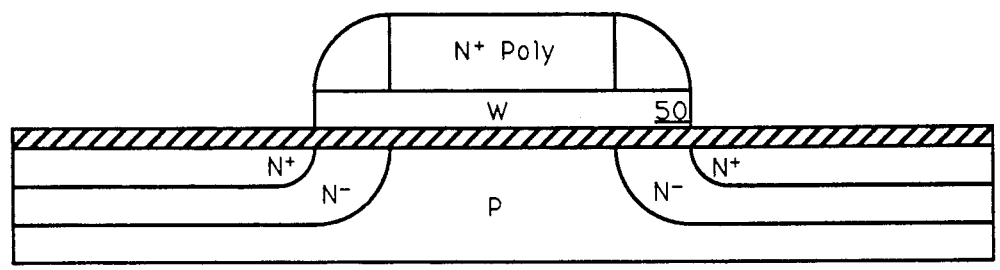

In FIG. 9a the tri-silicide composite inverse T-gate is fabricated by continuing the process of the composite inverse T-gate device from step 7d. A second source/drain implant is made with phosphorous atoms at a density of $5 \times 10^{13}$ atoms/cm$^2$ and an energy of 150 kev through the gate oxide and tungsten layers. The second implant provides n+ source/drain regions 58a and 58b for additional grading of the drain to improve hot electron resistance. It is to be appreciated that the n+ source/drain regions are formed in alignment with the outer edges of the oxide sidewall spacers 44a and 44b, however, later process steps may cause the n+ source/drain regions 58a and 58b to diffuse slightly though this is minimized by low temperature processing. In FIG. 9b the tungsten lower gate member 50 is formed by using RIE to etch the tungsten layer over the n+ source/drain regions 58a and 58b.

Figure 9C:
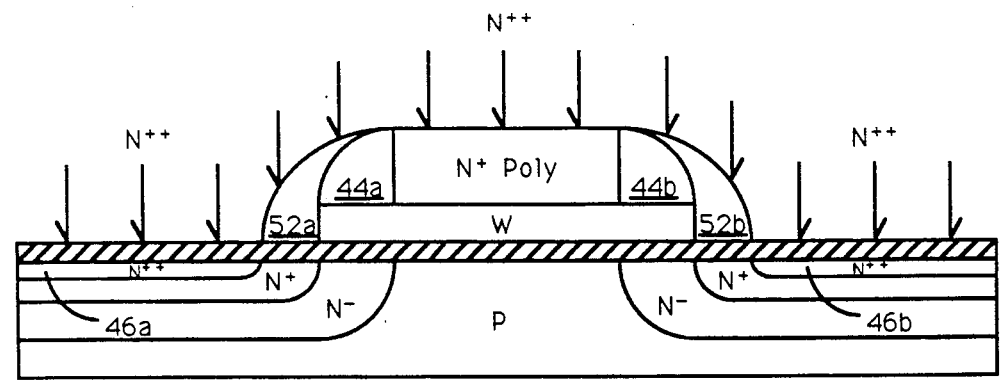
FIG. 9c illustrates the formation of second oxide spacers and the formation of the n++ source/drain regions in the substrate of FIG. 9b.

In FIG. 9c a second pair of oxide spacers 52a and 52b are formed to self-align a third source/drain implant. The second oxide spacers are formed adjacent to the first oxide spacers 44a and 44b on the gate oxide layer. The second oxide sidewall spacers are formed by depositing a low temperature oxide over the device and etching the layer anisotropically.

In FIG. 9c a third source/drain implant is made to form n++ source/drain regions 46a and 46b and to provide ohmic contacts. The additional grading of the drain improves the device's hot electron resistance. The third source/drain implant is made with Arsenic atoms at a density of $1 \times 10^{15}$ atoms/cm$^2$ and an energy of 80 kev.

Figure 9D:
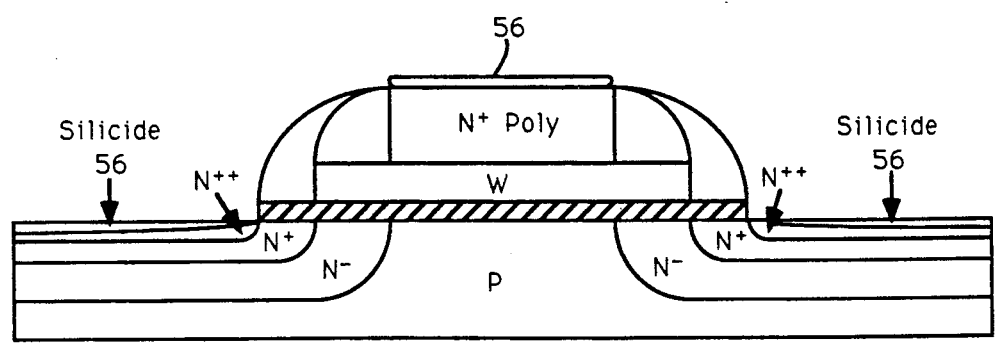
FIG. 9d illustrates the formation of silicide on the n++ source/drain regions of FIG. 9c.

In FIG. 9d titanium silicide is sputtered over the entire structure and annealed. The device is wet etched thereby selectively removing the silicide deposited on the second oxide spacers and leaving silicide on the gate, drain and source of the device. The silicide process decreases the resistivity of the n+ source/drain regions from 20 ohms per square to 4 ohms per square thereby decreasing the contact resistance of the device.

It is to be emphasized that although a n channel transistors have been described in detail herein, the present invention may also be practiced as a p channel transistor. In fabricating the p channel composite inverse T-gate metal-oxide-semiconductor device, the doping conductivities of the p channel device are simply opposite to those of the n channel device. The device is formed in an n substrate (or n well) with a p− source/drain region and a p+ source/drain region formed respectively therein. A tungsten lower gate member would still be utilized. The upper gate member would be p+ polysilicon although n+ polysilicon could also be used. Oxide spacers would still be used for alignment and masking.

It is also to be appreciated that well known process steps are used to complete the fabrication of the metal-oxide-semiconductor transistors of the present invention. For example, the width of the device is defined using one of the standard isolation techniques such as LOCOS. Following definition of source and drains an interlayer dielectric is deposited insulating the gate from the metal to be deposited next. Metal is deposited and patterned to interconnect the transistor with other devices in the VLSI circuit. A protective glass or passivation is formed over the device to protect the device from contamination and electrical shorts. In normal operation, 5 volts and ground would be inputted to the respective source, gate and drain regions.

Thus, a high-speed, submicron, metal-oxide-semiconductor and its method of fabrication have been described. The transistor has high immunity to hot electron degradation and is ideal for VLSI manufacturing techniques.

I claim:

1. In a process for making a metal-oxide-semiconductor transistor on a p type substrate comprising the steps of:
    forming an oxide layer on said p type substrate;
    forming a tungsten layer on said oxide layer;
    forming a polysilicon layer on said tungsten layer;
    forming an upper gate member of a first length from said polysilicon layer;
    forming a first source region and a first drain region in said p type substrate in alignment with said length of said polysilicon upper gate member for forming a pair of lightly doped regions;
    forming a sidewall spacer on adjacent sides of said polysilicon upper gate member on said tungsten layer for providing alignment for a second source region and a second drain region and for defining a lower gate member;
    forming a second source region and a second drain region in said first source region and said first drain region, respectively, in alignment with the outer edges of said sidewall spacers; and
    etching said tungsten layer over said second source region and said second drain region for forming said tungsten lower gate member.

2. The process for making a metal-oxide-semiconductor transistor of claim 1 further comprising the steps of:
    forming a second sidewall spacer adjacent to each of said first sidewall spacers covering said tungsten lower gate member for preventing said second source region and said second drain region from becoming shorted to said tungsten lower gate member by a silicide layer;
    forming silicide on said second source region and said second drain region and on said polysilicon upper gate member for reducing the contact resistance of the transistor.

3. In a process for making a metal-oxide-semiconductor transistor on a p type substrate comprising the steps of:
    forming an oxide layer on said p type substrate;
    forming a tungsten layer on said oxide layer;
    forming a polysilicon layer on said tungsten layer;
    forming an upper gate member of a first length from said polysilicon layer;
    forming a first source region and a first drain region in said p type substrate in alignment with said first length of said polysilicon upper gate member for forming a pair of lightly doped regions;
    forming a sidewall spacer on adjacent sides of said polysilicon upper gate member on said tungsten layer for providing alignment for a second source region and a second drain region and for defining a lower gate member;
    forming a second source region and a second drain region in said first source region and said first drain region, respectively, in alignment with the outer edges of said sidewall spacers;
    etching said tungsten layer over said second source region and said second drain region for forming said tungsten lower gate member;

forming a second sidewall spacer adjacent to each of said first sidewall spacers for providing alignment for a third source region and a third drain region; and forming a third source region and a third drain region in said second source region and said second drain region, respectively, in alignment with said second oxide sidewall spacers.

4. The process for making a metal-oxide-semiconductor transistor of claim 3 further comprising the steps of:

forming silicide on said third source region and said third drain region and on said polysilicon upper gate member for reducing the contact resistance of the transistor.

5. In a process for making a metal-oxide-semiconductor transistor on a n type substrate comprising the steps of:

forming an oxide layer on said n type substrate;
forming a tungsten layer on said oxide layer;
forming a polysilicon layer on said tungsten layer;
forming an upper gate member of a first length from said polysilicon layer;
forming a first source region and a first drain region in said n type substrate in alignment with said length of said polysilicon upper gate member for forming a pair of lightly doped regions;
forming a sidewall spacer on adjacent sides of said polysilicon upper gate member on said tungsten layer for providing alignment for a second source region and a second drain region and for defining a lower gate member;
forming a second source region and a second drain region in said first source region and said first drain region, respectively, in alignment with the outer edges of said sidewall spacers; and
etching said tungsten layer over said second source region and said second drain region for forming said tungsten lower gate member.

* * * * *

UNITED STATES PATENT AND TRADEMARK OFFICE
CERTIFICATE OF CORRECTION

PATENT NO. : 5,102,815
DATED : April 7, 1992
INVENTOR(S) : Julian J.B. Sanchez

It is certified that error appears in the above-indentified patent and that said Letters Patent is hereby corrected as shown below:

| | | |
|---|---|---|
| Col. 1, Line 15 | Delete "porcess" | Insert --process-- |
| Col. 1, Line 27 | Delete "source/dranin" | Insert --source/drain-- |
| Col. 1, Line 29 | Delete "widen" | Insert --wider-- |
| Col. 1, Line 42 | Delete "structrue" | Insert --structure-- |
| Col. 3, Line 62 | After the word "without" | Insert --degrading-- |

Signed and Sealed this

Twenty-seventh Day of September, 1994

Attest:

BRUCE LEHMAN

*Attesting Officer*      *Commissioner of Patents and Trademarks*